US011197395B1

(12) United States Patent
Gao (10) Patent No.: US 11,197,395 B1
(45) Date of Patent: Dec. 7, 2021

(54) MULTI-LAYER DATA CENTER COOLING INFRASTRUCTURE

(71) Applicant: Baidu USA LLC, Sunnyvale, CA (US)

(72) Inventor: Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 0 days.

(21) Appl. No.: 17/029,370

(22) Filed: Sep. 23, 2020

(51) Int. Cl.
  *H05K 7/20* (2006.01)
(52) U.S. Cl.
  CPC ..... *H05K 7/20745* (2013.01); *H05K 7/20145* (2013.01); *H05K 7/20354* (2013.01); *H05K 7/20772* (2013.01); *H05K 7/20309* (2013.01); *H05K 7/20318* (2013.01)
(58) Field of Classification Search
  CPC . H05K 7/20763–2079; H05K 7/20136–20145
  See application file for complete search history.

(56) References Cited

U.S. PATENT DOCUMENTS

| 7,907,395 B2 * | 3/2011 | Weber | H05K 7/20818 361/679.47 |
| 8,472,182 B2 * | 6/2013 | Campbell | H05K 7/20781 361/679.49 |
| 10,212,858 B2 * | 2/2019 | Noteboom | H05K 7/20745 |
| 10,531,597 B1 * | 1/2020 | Eichelberg | H05K 7/20136 |
| 2011/0223849 A1 * | 9/2011 | Ishimine | F24F 3/044 454/184 |

FOREIGN PATENT DOCUMENTS

WO    WO-2012140466 A1 * 10/2012 ......... H05K 7/20836

* cited by examiner

*Primary Examiner* — Zachary Pape
(74) *Attorney, Agent, or Firm* — Womble Bond Dickinson (US) LLP (57) ABSTRACT

Embodiments are disclosed of a cooling system for use in a data center. The cooling system includes an IT region, a ceiling region, and a cooling air plenum sandwiched between the IT region and the ceiling region. The IT region includes one or more IT plenums that are coupled to the cooling air plenum to supply cooling air to the IT region, which can have house a plurality of IT racks that are clustered around the IT plenums and are adapted to house one or more pieces of liquid-cooled or hybrid-cooled information technology (IT) equipment. The ceiling region includes one or more ceiling plenums and one or more sets of heat exchangers, each heat exchanger being cooled by the cooling air delivered to the ceiling plenums. The cooling air plenum is fluidly coupled by a flow control to the one or more IT plenums and is fluidly coupled by a flow control to the one or more ceiling plenums or to the volume of the ceiling region between ceiling plenums.

20 Claims, 8 Drawing Sheets

MULTI-LAYER DATA CENTER COOLING INFRASTRUCTURE

TECHNICAL FIELD

The disclosed embodiments relate generally to liquid cooling systems for temperature control of electronic equipment and in particular, but not exclusively, to a multi-layer data center cooling system for temperature control in data center equipment.

BACKGROUND

Much modern information technology (IT) equipment such as servers, blade servers, routers, edge servers, etc., generates a substantial amount of heat during operation. The heat generated by individual components, especially high-power components such as processors, makes many of these individual components impossible or difficult to cool effectively with air cooling systems. Much modern IT equipment therefore requires liquid cooling or liquid-air hybrid cooling.

In liquid-air hybrid cooling, a liquid cooling loop is formed between heat-generating components in a piece of IT equipment and a liquid-air heat exchanger. Operation of the liquid-cooling loop has several steps. First, heat from the heat-generating components is transferred through fluid connections in the loop to a working liquid. The heated working liquid is then transferred to the liquid-to-air heat exchanger, in some cases through multiple heat transfer loops, where heat from the working liquid is transferred to air, usually atmospheric air. The working liquid, now cool after its heat has been transferred to the air, is returned to the heat-generating component to cool it again; the heated air is then exhausted into the atmosphere or used for some other purpose.

Because substantially all heat extracted from the components is eventually transferred to airflow, either directly or indirectly through a liquid cooling loop, efficient airflow management is needed for hybrid cooling, but existing airflow management solutions do not provide airflow efficiently enough to clusters of IT equipment, especially when the IT equipment is hybrid-cooled, meaning that the cooling air can be not efficiently or accurately distributed or managed to the heat load.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

FIGS. 2A-2B are cross-sectional side views of an embodiment of a data center cooling system. FIG. 2A shows the cooling system as viewed looking down rows of IT racks, while FIG. 2B shows the cooling system as viewed looking at the front or backs of IT racks.

DETAILED DESCRIPTION

Embodiments are described of a multi-layer data center cooling system. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

Airflow management can improve data center and IT cluster operating efficiency. With the increasing use of data centers, their energy consumption is becoming larger and larger—so much so that they can account for a large fraction of the total energy consumption of an entire city. There are therefore never-ending efforts to improve the energy efficiency of data centers. Modern data center designs require versatility and the ability to accommodate different generations of IT systems, but cost and efficiency always a consideration. This requires engineers and scientists to develop and invent new cooling architectures.

The described embodiments provide an innovative airflow distribution system using a multi-layer airflow distribution system that aims to improve airflow management efficiency and system versatility and flexibility. The described embodiments enable accurate and efficient distribution and management of airflow to the heat loads—both the heat loads that are directly air-cooled and the heat loads that are liquid-cooled. This not only separates the different cooling airflows but also enables delivery of airflow where is needed, since the air-cooled portion and liquid-cooled portion are different. The current architecture also compatible for different cooling solutions, and it can be easily implemented in either brownfield and greenfield data centers. In addition, it is a very efficient architectural concept for modular and container design.

Embodiments of an airflow distribution system using a multilayer design are described. The cooling airflow is distributed from an intermediate section of the system through its dedicated cooling air plenum. The airflow is distributed to both a ceiling region and an IT region to cool the liquid cooling unit and the IT equipment directly. The ceiling region is designed with raised air flow distribution, and the IT region is designed with cooling air blown down from the top. The cooling air plenum is the only portion receiving air from a cool air source, and the cool air is managed so that it can be distributed to different regions. The design also includes different cooling air intake modes using the cooling air plenum—e.g., one economized intake mode and an enhanced intake mode—to enable a more efficient system operation. The described embodiments of the system include several modules; this modular design enables the system to be accommodated in either a hyper-scale data center design or a container design.

Figure 1:
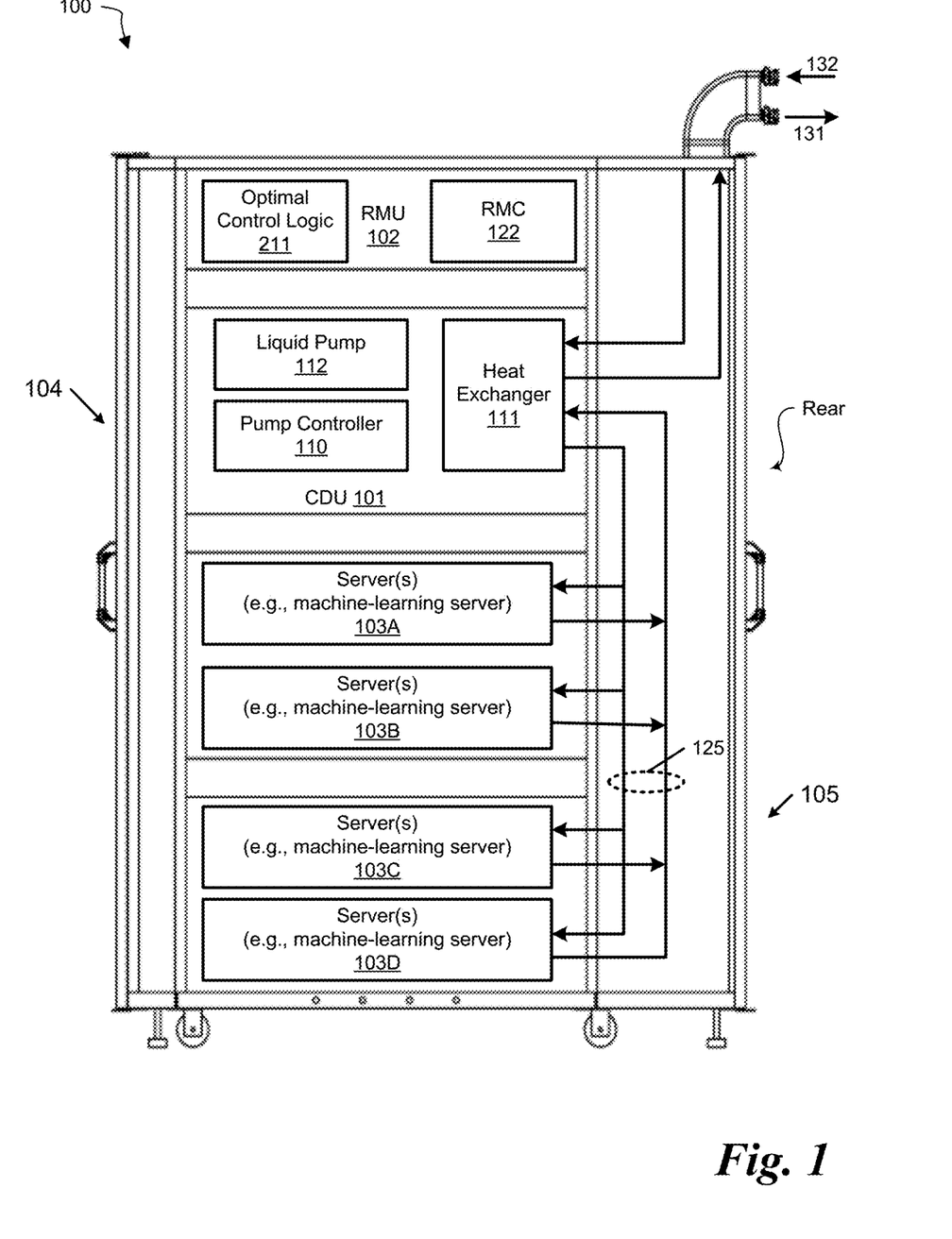
FIG. 1 is a block diagram of an embodiment of an electronic rack with electronics and cooling systems housed within.

FIG. 1 is a block diagram illustrating a side view of an embodiment of an electronic rack. In one embodiment, electronic rack 100 includes CDU 101, rack management unit (RMU) 102, and one or more server blades 103A-103D, collectively referred to as server blades 103. Server blades 103 can be inserted into an array of server slots respectively from front end 104 of electronic rack 100. Note that although only four server blades 103A-103D are shown, more or fewer server blades can be maintained within electronic rack 100. Also note that the particular positions of CDU 101, CMU 102, and server blades 103 are shown for the purpose of illustration only; other arrangements or configurations of CDU 101, CMU 102, and server blades 103 can also be implemented. Further, the front door disposed on front end 104 and the back door disposed on back end 105 are optional. In some embodiments, there can no door on front end 104 and/or back end 105.

In one embodiment, CDU 101 includes heat exchanger 111, liquid pump 112, and pump controller 110. Heat exchanger 111 can be a liquid-to-liquid heat exchanger. Heat exchanger 111 includes a first tube having a first pair of liquid connectors coupled to external liquid supply/return lines 131-132 to form a primary loop, where the connectors coupled to the external liquid supply/return lines 131-132 can be disposed or mounted on back end 105 of electronic rack 100. In addition, heat exchanger 111 further includes a second tube having a second pair of liquid connectors coupled to liquid manifold 125, which can include a supply manifold to supply cooling liquid to server blades 103 and a return manifold to return warmer liquid back to CDU 101. The processors can be mounted on the cold plates, where the cold plates include a liquid distribution channel embedded therein to receive the cooling liquid from the liquid manifold 125 and to return the cooling liquid carrying the heat exchanged from the processors back to the liquid manifold 125. Supply/return lines 131-132 can be fluidly coupled to a liquid-to-air heat exchanger in a ceiling region (see FIG. 2A et seq.).

Each server blade 103 can include one or more IT components (e.g., CPUs, GPUs, memory, and/or storage devices). Each IT component can perform data processing tasks, where the IT component can include software installed in a storage device, loaded into the memory, and executed by one or more processors to perform the data processing tasks. Server blades 103 can include a host server (referred to as a host node) coupled to one or more compute servers (also referred to as compute nodes). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the compute servers (having one or more GPUs) managed by the host server. The compute servers perform the actual tasks, which can generate heat during the operations.

Electronic rack 100 further includes RMU 102 configured to provide and manage power supplied to server blades 103 and CDU 101. RMU 102 can be coupled to a power supply unit (not shown) to manage the power consumption of the power supply unit, as well as other thermal management of the power supply unit (e.g., cooling fans). The power supply unit can include the necessary circuitry (e.g., an alternating current (AC) to direct current (DC) or DC to DC power converter, battery, transformer, or regulator, etc.,) to provide power to the rest of the components of electronic rack 100.

In one embodiment, RMU 102 includes optimal control logic 111 and rack management controller (RMC) 122. The optimal control logic 111 is coupled to at least some of server blades 103 to receive operating status of each of the server blades 103, such as processor temperatures of the processors, the current pump speed of the liquid pump 112, and liquid temperature of the cooling liquid, etc. Based on this information, optimal control logic 111 determines an optimal pump speed of the liquid pump 112 by optimizing a predetermined objective function, such that the output of the objective function reaches the maximum while a set of predetermined constraints is satisfied. Based on the optimal pump speed, RMC 122 is configured to send a signal to pump controller 110 to control the pump speed of liquid pump 112 based on the optimal pump speed.

Figure 2A:
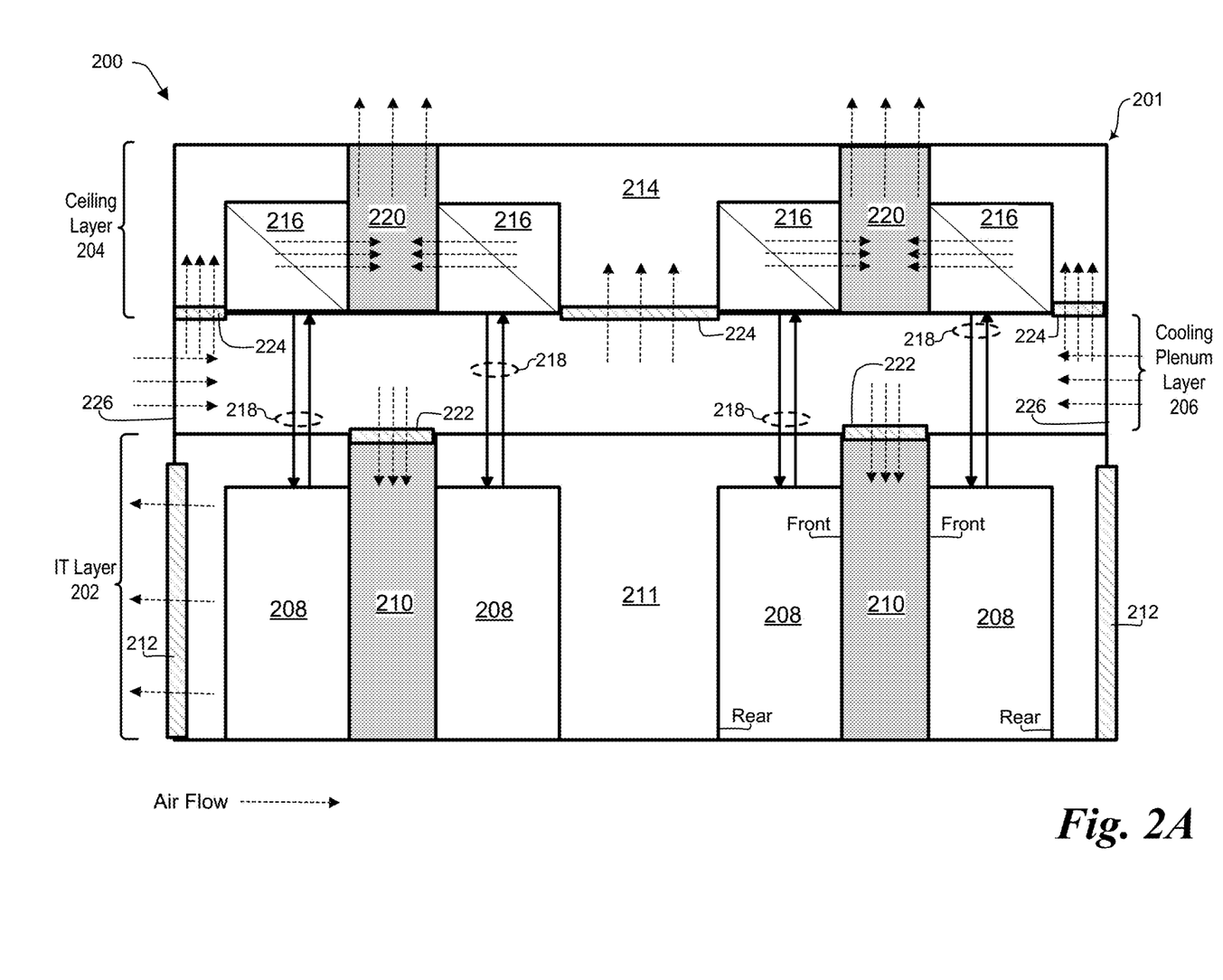
Figure 2B:
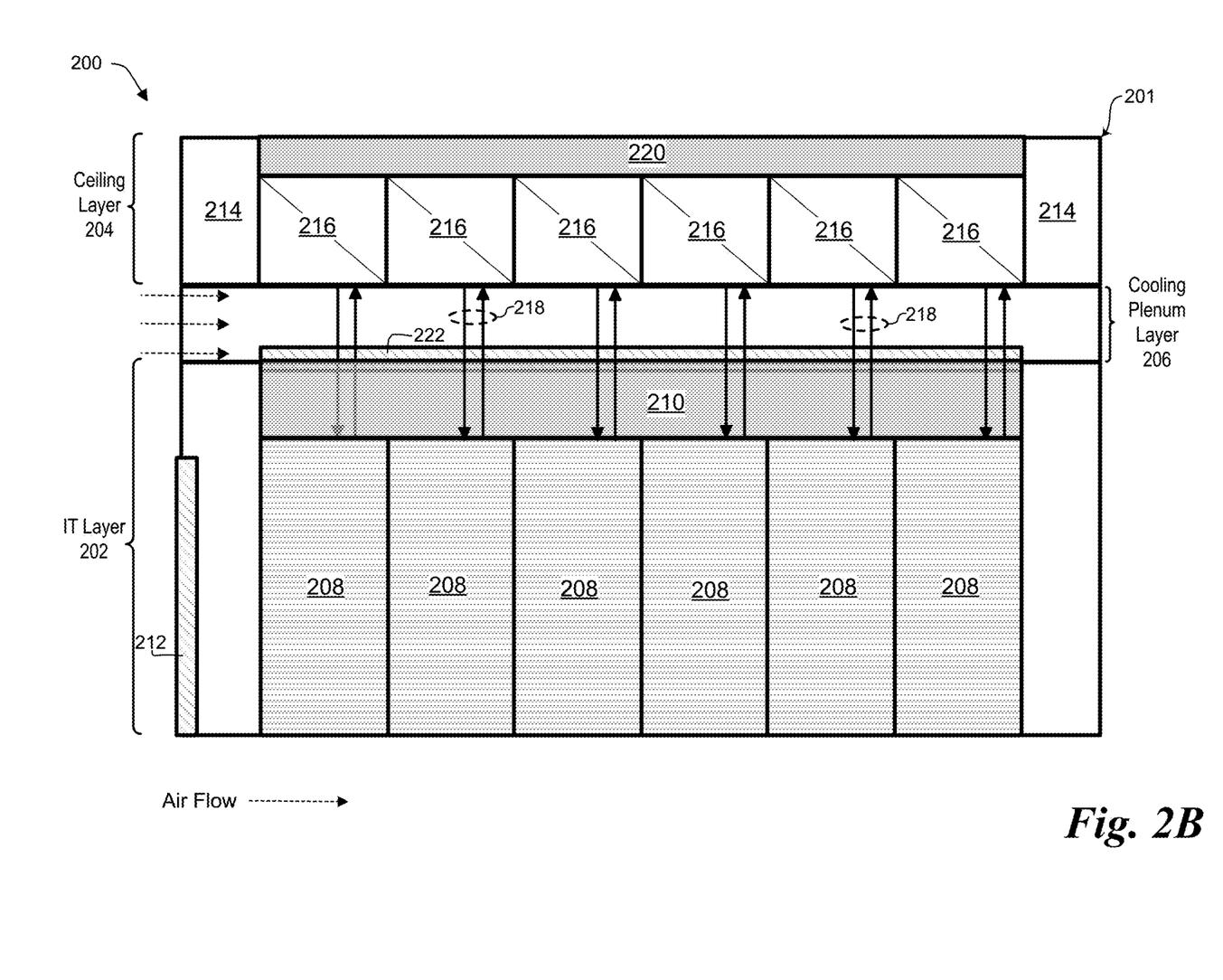

FIGS. 2A-2B together illustrate an embodiment of a multi-layer data center cooling system 200. FIG. 2A is a view looking from the ends or rows of racks, while FIG. 2B is a view of the same racks viewed from the side, either from the cold aisle looking at the front side of the racks, or from the hot aisle looking at the rear side of the racks. Cooling system 200 is positioned in a data center 201 and includes three layers: an information technology (IT) layer 202 in which IT equipment requiring cooling is placed, a ceiling layer 204 positioned above the IT layer, and a cooling plenum layer 206 sandwiched between the IT layer and the ceiling layer.

IT layer 202 is the layer where IT equipment requiring cooling is placed. One or more pieces of IT equipment such as servers, blade servers, routers, etc., are positioned in one or more IT racks 208. Racks 208 can also include liquid-cooling elements that are fluidly coupled to liquid cooling elements of the IT equipment housed in the rack (see, e.g., FIG. 1), as well as being fluidly coupled to liquid cooling elements of the data center's cooling system, as further discussed below. Examples of liquid-cooling elements that can be placed in rack 208 include heat exchangers, pumps, pump controllers and associated logic, manifolds, and fluid connections to provide the fluid coupling among elements (see FIG. 1). Each rack 208 can also include provisions for cooling of the IT equipment using cool air flowing through the rack. Each rack 208 has a front side through which cool air can enter the rack and a rear side through which hot air can exit the rack. Some embodiments of racks 208, or of the IT equipment inside the rack, can use air-moving elements such as fans to draw cool air through the front side and exhaust hot air out the backside.

In IT layer 202, one or more racks 208 are arranged in rows and clustered (i.e., grouped into clusters) around an IT plenum 210. In the illustrated embodiment IT plenums 210 are vertical, but in other embodiments they can have a different orientation. In each cluster, each rack 208 has its front side fluidly coupled to a corresponding IT plenum 210, so that cool air can flow from each IT plenum 210 into the front ends of all the racks 208 that are clustered around it. The rear side of each rack 208 is fluidly coupled to the interior volume 211 of the IT layer, such that the racks and up grouped into a hot aisle/cold aisle arrangement, with IT plenums 210 forming a cold aisle and volume 211 forming a hot aisle. In the illustrated embodiment, IT layer 202 also includes exhaust vents 212 that fluidly couple the interior volume 211 of the IT layer to the outside of the data center. Hot air exiting the rear side of each rack can be exhausted or vented from interior volume 211 to the exterior of data center 201 through exhaust vents 212.

Ceiling layer 204 is positioned above IT layer 202 and includes a volume 214 within which are positioned one or more liquid-to-air heat exchangers 216—that is, in this design, heat exchangers in which heat is transferred from a liquid to air or, put differently, heat exchanges in which air is used to cool a liquid. Each heat exchanger 216 is fluidly coupled to at least one rack's supply and return connections (see FIG. 1, elements 132 and 131) by a pair of fluid connections 218. Each pair of fluid connections 218 includes a supply connection and a return connection, as indicated by the arrows. The illustrated embodiment of cooling system 200 has a one-to-one correspondence between racks 208 and heat exchangers 216—i.e., each rack is fluidly coupled to a single corresponding heat exchanger. But in other embodiments there can be a one-to-many correspondence between racks and heat exchangers (each rack is fluidly coupled to more than one heat exchanger), a many-to-one correspondence between racks and heat exchangers (more than one rack is fluidly coupled to each heat exchanger), or a many-to-many correspondence between racks and heat exchangers (more than one rack is coupled to more than one heat exchanger). Also positioned within volume 214 of ceiling layer 204 are ceiling plenums 220. In ceiling layer 204, one or more liquid-to-air heat exchangers 216 are clustered (i.e., grouped into clusters) around each ceiling plenum 220. In each cluster, each heat exchanger 216 is fluidly coupled to its corresponding ceiling plenum 220 (this can be understood as hot air containment), so that hot air can flow from each heat exchanger into its corresponding ceiling plenum; in this embodiment, then, ceiling plenums 220 act as exhaust plenums, which means the hot air is exhausted directly to the ambient. In other embodiments, ceiling plenums 220 can be implemented in different locations or sides of ceiling layer 204.

Cooling plenum layer 206 is sandwiched between IT layer 202 and ceiling layer 204 to provide cooling air to both layers. Cooling plenum layer 206 includes at least one air intake 226 through which cool air can enter the layer. In the illustrated embodiment, a pair of air intakes 226 are positioned in the walls of the data center, so that cool outdoor air can be brought into the cooling air plenum from outside data center 201. Cooling plenum layer 206 also includes multiple outlets through which cool air from the cooling plenum can be directed and distributed into the IT layer and the ceiling layer. In the illustrated embodiment, the cooling plenum layer 206 is fluidly coupled to IT plenums 210 by flow controls 222, and is also fluidly coupled to volume 214 of ceiling layer 204 by flow controls 224. Flow controls 222 and 224 can be used to regulate the flow into their respective plenums, and can range from completely open to completely closed and anywhere in between. In one embodiment, flow controls 222 and 224 can be adjustable louvers that control the amount of airflow passing through them, but in other embodiments they can be another type of flow control. For instance, in other embodiments the flow controls can be perforated openings or any similar structures. Although not shown in this figure, cooling plenum layer 206 can also include air-moving elements such as fans to assist or optimize airflow through the cooling plenum layer (see, e.g., FIG. 4).

In operation of system 200, cool air flows into cooling plenum layer 206 through intakes 226. The airflow path through the system is represented in the figures by dashed arrows. Cool air flowing into and through the cooling plenum layer is then supplied to the IT layer and the ceiling layer. In the IT layer, cool air from the cooling plenum layer flows through flow controls 222 into IT plenums 210. The front sides of racks 208 are fluidly coupled to the IT plenums, so that the cool air flowing from the cooling air plenum into the IT plenums is directed into racks 208. Cool air flowing into the front side of each rack 208 flows over the IT components within the rack, absorbs heat from the IT components, and exits the rear side of each rack. The hot air exiting the back of each rack 208 into IT layer volume 211 is then exhausted through vents 212 to the outside of the data center.

In ceiling layer 204, the liquid cooling loops are in operation, with hot and cool liquid flowing through the supply and return lines 218: hot liquid from racks 208 enters heat exchangers 216 and is cooled, and the cool fluid then flows back to the racks. Although not shown in the drawing, a pumping system for recirculating the fluid running with 218 can be present in some embodiments. But in other embodiments, no pump may be needed for the loop 218, such as for a self-driving thermosiphon system. At the same time, cool air from cooling plenum layer 206 flows through flow controls 224 into ceiling volume 214. Once in ceiling volume 214, the cool air flows through heat exchangers 216 and into ceiling plenums 220, which in this embodiment act as exhaust plenums. The air flowing through the heat exchangers extracts heat from the liquid as it flows through the heat exchanger. Having flowed through heat exchangers 216, the now-hot air flows into ceiling plenums 220 and flows out of the data center.

Figure 3:
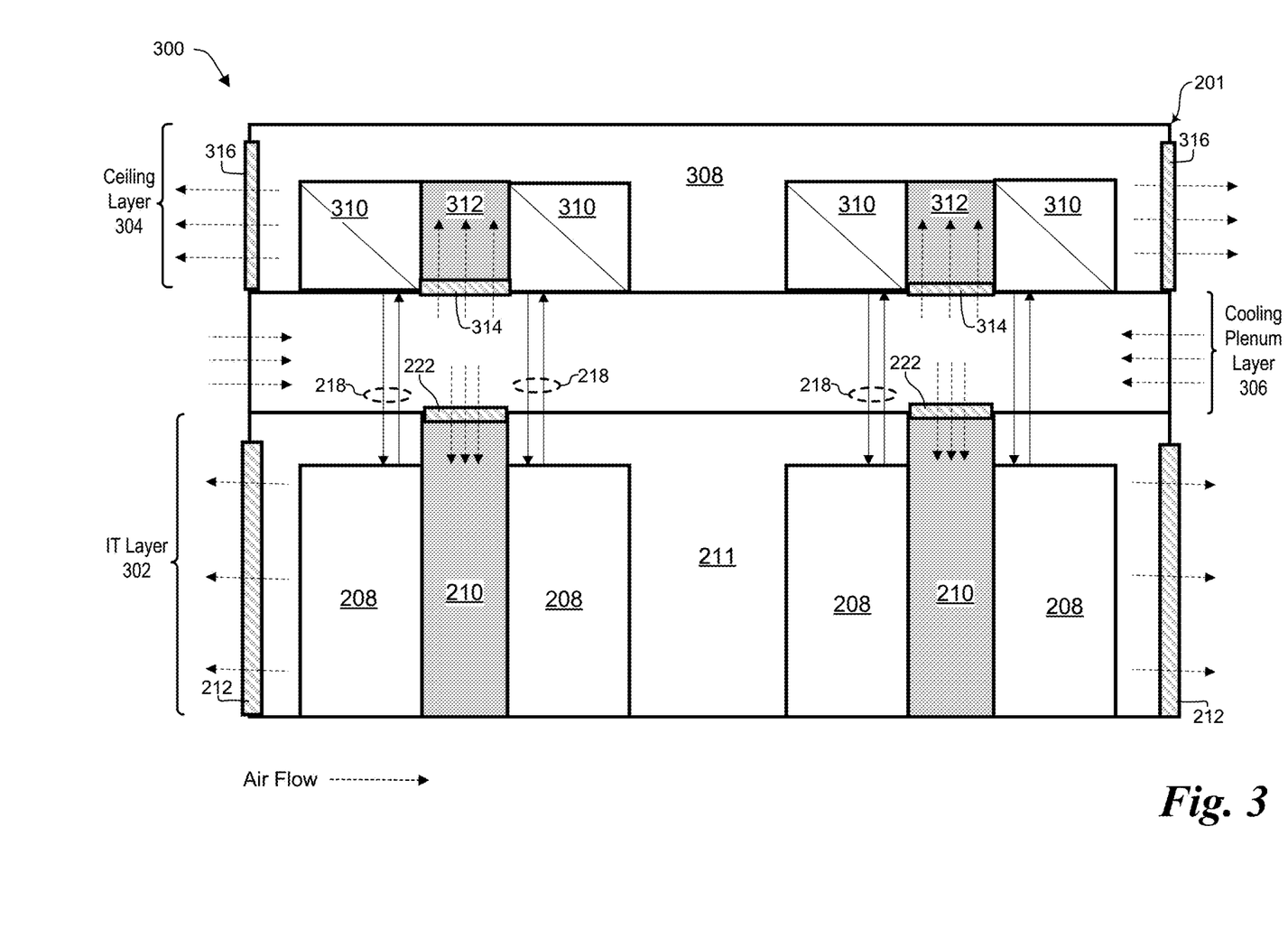
FIG. 3 is a side view of another embodiment of a data center cooling system as viewed looking at the end of rows of IT racks.

FIG. 3 illustrates another embodiment of a data center cooling system 300. System 300 includes three layers—an IT layer 302, a ceiling layer 304 positioned above the IT layer, and a cooling plenum layer 306 sandwiched between the IT layer and the ceiling layer. IT layer 302 and cooling plenum layer 306 are substantially similar to the IT layer 202 and cooling plenum layer 206 in system 200, and include substantially the same elements arranged in substantially the same ways. The primary difference between cooling systems 200 and 300 is in ceiling layer 304.

Ceiling layer 304 includes a volume 308 within which are positioned one or more liquid-to-air heat exchangers 310. Each heat exchanger 310 is fluidly coupled to rack's supply and return connections (see FIG. 1) by a pair of fluid connections 218; each pair of fluid connections 218 includes a supply connection and a return connection, as indicated by the arrows. As in system 200, in cooling system 300 there can be a one-to-one correspondence between racks 208 and heat exchangers 216 (each rack is fluidly coupled to a single corresponding heat exchanger), a one-to-many correspondence between racks and heat exchangers (each rack is fluidly coupled to more than one heat exchanger), a many-to-one correspondence between racks and heat exchangers (more than one rack is fluidly coupled to each heat exchanger), or a many-to-many correspondence between racks and heat exchangers (more than one rack is coupled to more than one heat exchanger).

Also positioned within volume 214 of ceiling layer 204 are ceiling plenums 312 that are fluidly coupled to cooling plenum layer 306 by flow controls 314. In the illustrated embodiment ceiling plenums 312 are vertically oriented, but in other embodiments they can be oriented differently. In ceiling layer 304, one or more liquid-to-air heat exchangers 310 are clustered (i.e., grouped into clusters) around each ceiling plenum 312. In each cluster, each heat exchanger 310 is fluidly coupled to its corresponding ceiling plenum 312, so that cold air can flow from each ceiling plenum into its corresponding heat exchanger 310. In system 300, then, ceiling layer 304 has a cold aisle/hot aisle arrangement, with ceiling plenums 312 forming cold aisles and volume 308 forming hot aisles, and this can be understood as that the ceiling layer forms a hot aisle, since the cold aisle is contained as plenums 312.

In operation of system 300, IT layer 302 and cooling plenum layer 306 operate similarly to IT layer 202 and cooling plenum layer 202 of system 200, but ceiling layer 304 operates differently. In ceiling layer 304, the liquid cooling loops are in operation, with hot and cool liquid flowing through the supply and return lines 218. At the same time, cool air from cooling plenum layer 306 flows through flow controls 314 into ceiling plenums 312. From ceiling plenums 312, the cool air flows into and through heat exchangers 216 into exhaust volume 308, extracting heat from the liquid as it flows through the liquid-to-air heat exchanger. The now-hot air flows from volume 308 through exhausts 316 to the exterior of data center 201.

Figure 4:
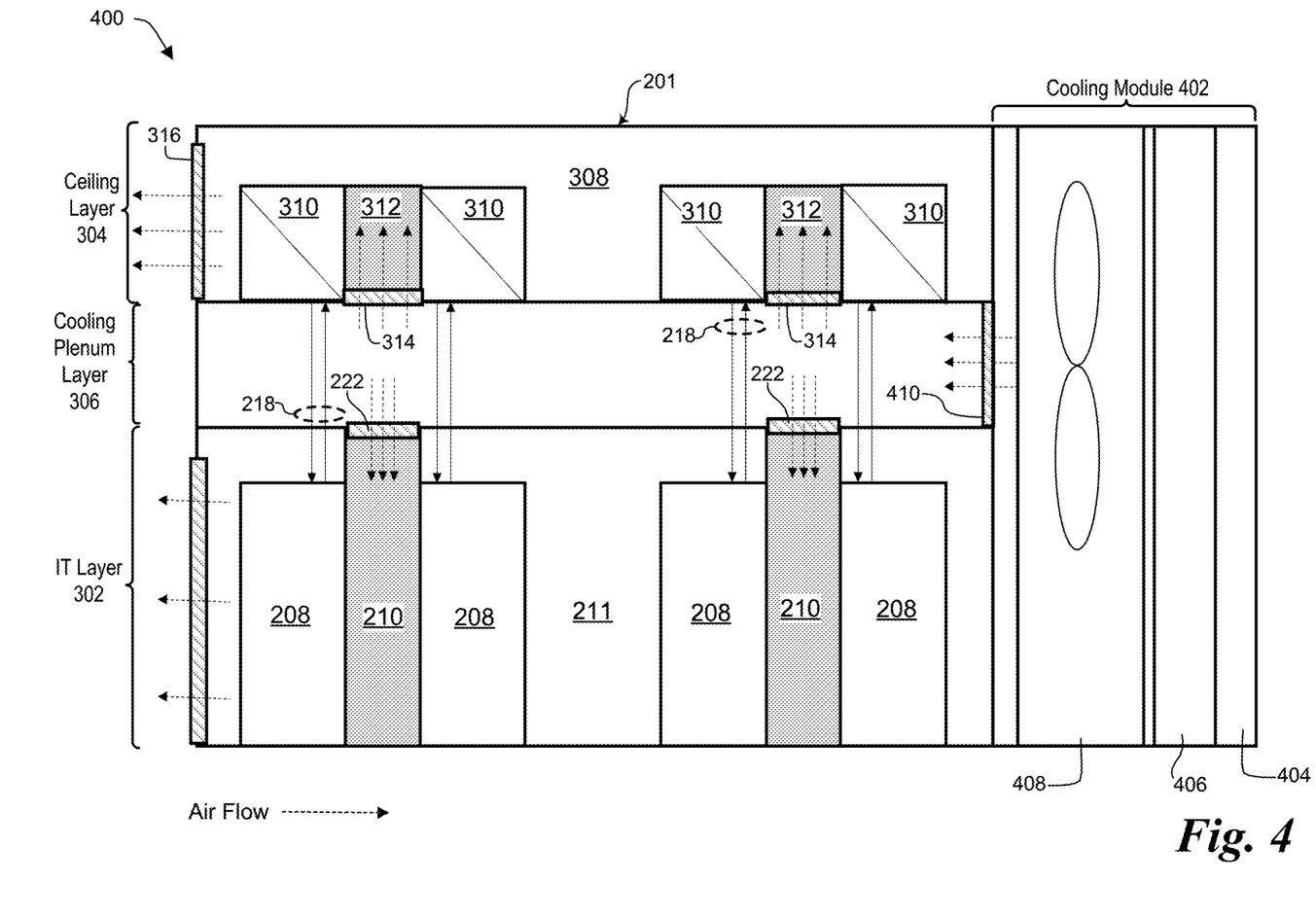
FIG. 4 is a side view of another embodiment of a data center cooling system as viewed looking at the end of IT racks.

FIG. 4 illustrates another embodiment of a data center cooling system 400. System 400 is in most respects similar to system 300: it includes an IT layer 302, a ceiling layer 304 positioned above the IT layer, and a cooling plenum layer 306 sandwiched between the IT layer and the ceiling layer. All three layers are substantially as described above in connection with FIG. 3, except for ceiling layer 304, which is modified as described below.

The primary difference between cooling systems 300 and 400 is the inclusion in system 400 of an external cooling module 402. System 400 provides a more complete solution that combines both system 300 and cooling module for supplying airflow to the cooling plenum layer 306. In some circumstances, the air quality outside data center 201—measure, for instance, by temperature, humidity, and the presence of chemicals or particulates, or other quantities—may not allow ambient air to be used for cooling without further conditioning; in such circumstances, cooling module 402 can provide the conditioning. In the illustrated embodiment, cooling module 402 includes a cooling unit 404 to change the temperature of outside air, usually by cooling it; one or more filtration units 406 to provide chemical or mechanical filtration that removes chemicals and particulates; and a fan unit 408 to drive the cooled and/or filtered air into cooling plenum layer 306. In one embodiment, the cooling unit 404 may be the same as cooling module 402. Other embodiments of cooling module 402 can include more or less units than shown. Other components used to implement open or closed loop control of cooling module 402—temperature sensors, controllers, etc.—are not shown in the figure but can nonetheless be used in some embodiments.

Cooling module 402 is fluidly coupled to cooling plenum layer 306 by a flow control 410, so that the flow control can be used to regulate the amount of air entering the cooling plenum layer. Use of cooling module 408 allows more cubic feet per minute (CFM) of cool air to be circulated through the data center, thus providing more heat transfer capacity and allowing the data center to operate at higher power (i.e., more kilowatts (kW)). The single-intake design of cooling plenum layer 306 provides a convenient and accessible place for the addition of cooling module 402, making the entire cooling system 400 more flexible.

In operation of system 400, IT layer 302 and cooling plenum layer 306 operate substantially as described above for system 300, except that the cool air flowing into cooling plenum layer 306 is now pre-conditioned (heated/cooled, humidified/dehumidified and filtered) and is driven through the plenum cooling layer by fan unit 408. In addition to fan unit 408, flow control 410 can help regulate or optimize the amount of cool air flowing into the cooling plenum layer. Hot air is exhausted from volume 308 of ceiling layer 304 as described above for system 300, but in the ceiling layer, exhaust 316 is eliminated at the location where cooling module 402 is added, so that hot air is exhausted from the volume 308 through a different number of exhausts 316 than in system 300.

Figure 5:
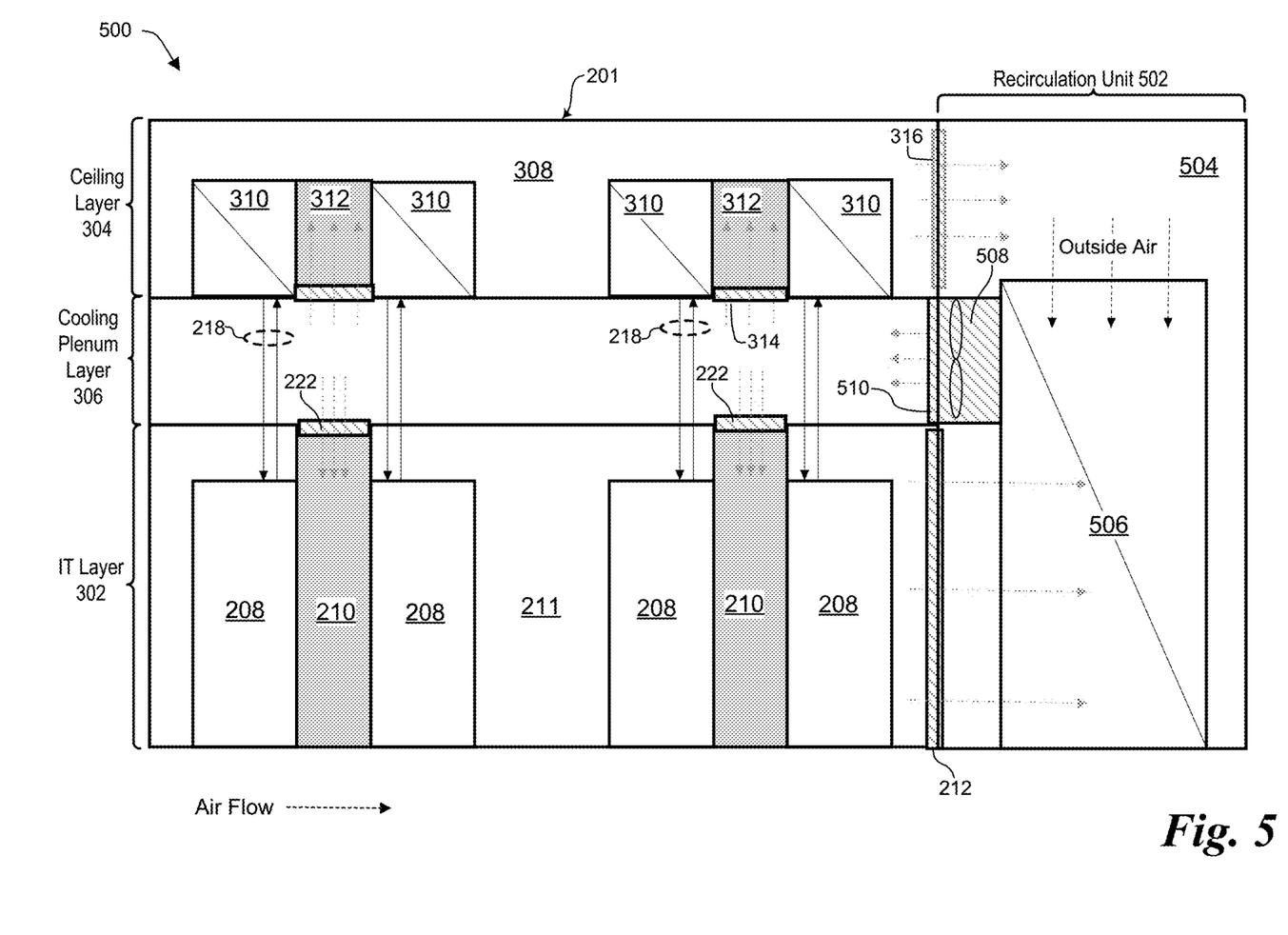
FIG. 5 is a side view of another embodiment of a data center cooling system as viewed looking at the end of IT racks.

FIG. 5 illustrates another embodiment of a data center cooling system 500. System 500 is in most respects similar to systems 300 and 400: it includes an IT layer 302, a ceiling layer 304 positioned above the IT layer, and a cooling plenum layer 306 sandwiched between the IT layer and the ceiling layer. All three layers are substantially as described above in connection with FIGS. 3-4, except for ceiling layer 304, which is slightly modified as described below.

The primary difference between cooling system 500 and cooling systems 300 and 400 is the inclusion in system 500 of a recirculation unit 502. In some circumstances, the air quality outside data center 201—measured, for instance, by temperature, humidity, the presence of chemicals or particulates, or other quantities—may not allow the use of ambient air from the outside for cooling the data center. One way to avoid using outside air is to recirculate the air within the data center instead of taking in ambient air from the outside. Recirculation module 502 can provide that recirculation.

Recirculation module 502 is positioned outside data center 201 and includes a volume 504. An external cooling unit 506 is positioned within volume 504. Volume 308 of ceiling layer 304 is fluidly coupled to volume 504 via exhaust 316, while volume 211 of IT layer 302 is coupled to volume 504 by exhaust 212. External cooling unit 506 is also fluidly coupled to the exterior, directly or via volume 504, so that outside air can flow through external cooling unit. External cooling unit 506 is also fluidly coupled to cooling plenum layer 306 by a fan unit 508 and a flow control 510. In various embodiments, the external cooling unit can be a chilled water system, an evaporative cooling unit, or any other type of heat exchanger for extracting the heat from the internal air. And, although illustrated as a single unit, in other embodiments the cooling can be performed by multiple units. Other components used to implement open or closed loop control of recirculation unit 502—temperature sensors, controllers, etc.—are not shown in the figure but can nonetheless be present in some embodiments.

In operation of system 500, IT layer 302 and ceiling layer 304 operate substantially as before: cool air flows from cooling plenum layer 306 into IT layer 302 through IT plenums 210 and also flows into ceiling layer 304 through ceiling plenums 312. Hot air from both the ceiling layer and the IT layer is directed into recirculation unit 502 through exhausts 316 and 212 respectively. After entering the recirculation unit, the hot air from IT layer 302 and ceiling layer 304 is directed into external cooling unit 506, where heat from the hot internal air is transferred to the external air. In some embodiments air ducting may be used in recirculation unit 502 for containing air flow between the IT and ceiling layers and the external cooling unit 506, so that outside air is separated from internal air. After transferring its heat to the external air, the now-cooled air that originated from IT layer 302 and ceiling layer 304 is recirculated into cooling plenum layer 306 by fan unit 508 and flow control 510, which then again carries the cool air to IT layer 302 and ceiling layer 304.

Figure 6:
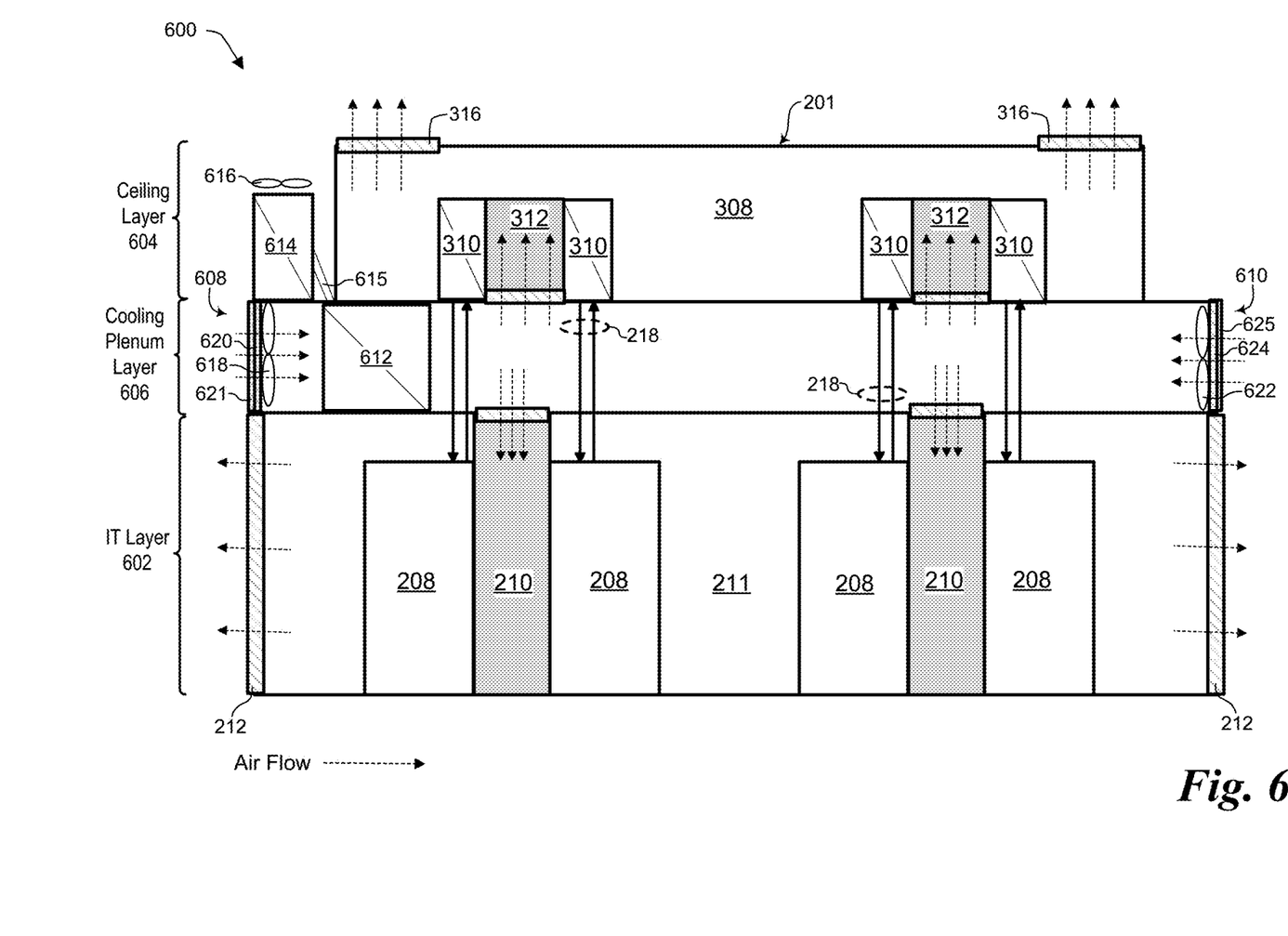
FIG. 6 is a side view of another embodiment of a data center cooling system as viewed looking at the end of IT racks.

FIG. 6 illustrates another embodiment of a data center cooling system 600. System 600 is in most respects similar to system 300: it includes an IT layer 602, a ceiling layer 604 positioned above the IT layer, and a cooling plenum layer 606 sandwiched between the IT layer and the ceiling layer. IT layer 602 and ceiling layer 604 are substantially as described above in connection with FIGS. 3-5, except for ceiling layer 604, which is slightly modified as described below. The primary difference between cooling system 600 and cooling system 300 is that in system 600, cooling plenum layer 606 has multiple air intakes with different functions. In the illustrated embodiment, cooling plenum layer has two air intakes: an enhanced intake 608 and an economized intake 610.

In some circumstances, the air quality outside data center 201—measured, for instance, by temperature, humidity, the presence of chemicals or particulates, or other quantities—may not allow the use of ambient air taken directly from outside for cooling the data center. In such situations, it can be desirable to enhance the ambient air from the outside. Enhanced air intake 608, as its name implies, provides enhancement functions. In the illustrated embodiment, enhanced air intake 608 includes a cooling system with an evaporator 612, a condenser 614, and a fan 616. Evaporator 612 is positioned at or near the entrance of cooling plenum layer 606, so that air entering the cooling plenum layer through enhanced intake 608 flows through the evaporator and is cooled before proceeding into the rest of the system. Condenser 614 is positioned outside data center 201 and is fluidly coupled to evaporator 612 by a refrigerant loop 615 that includes a return line through which vapor or a liquid/vapor mix can travel through from the evaporator to the condenser, and a supply line through which liquid can travel from the condenser to the evaporator. Although not shown in this figure, the refrigerant loop can also include a compressor. A fan 616 can be coupled to condenser 614 to help it condense vapor into liquid more quickly. In addition to the cooling system, enhanced intake 608 can include a flow control 621 that can completely close enhanced intake 610, completely open the intake, or adjust it anywhere in between completely closed and completely open. Enhanced intake 608 can also include one or more mechanical or chemical filters 618.

Economized intake 610 can include a fan 622 to increase the flow of air into cooling plenum payer 606, as well as a flow control 624 to adjust the amount of air flowing into the plenum. The flow control can completely close economized intake 610, can completely open the intake, or can adjusted anywhere in between completely closed and completely open. Economized intake 610 can also include one or more mechanical or chemical filters 625.

In operation, enhanced intake 608 and economized intake 610 can operate independently. At any given time one can be open and the other closed, or both can be open simultaneously. When open simultaneously, enhanced intake 608 and economized intake 610 can have the same or different flow rates. Once cool airflow is established using one or both intakes, the cool air proceeds through cooling plenum layer 606 to IT layer 602 and ceiling layer 604, as discussed above for system 300. System 600 provides flexibility to accommodate different heat load requirements and different ambient conditions.

Figure 7:
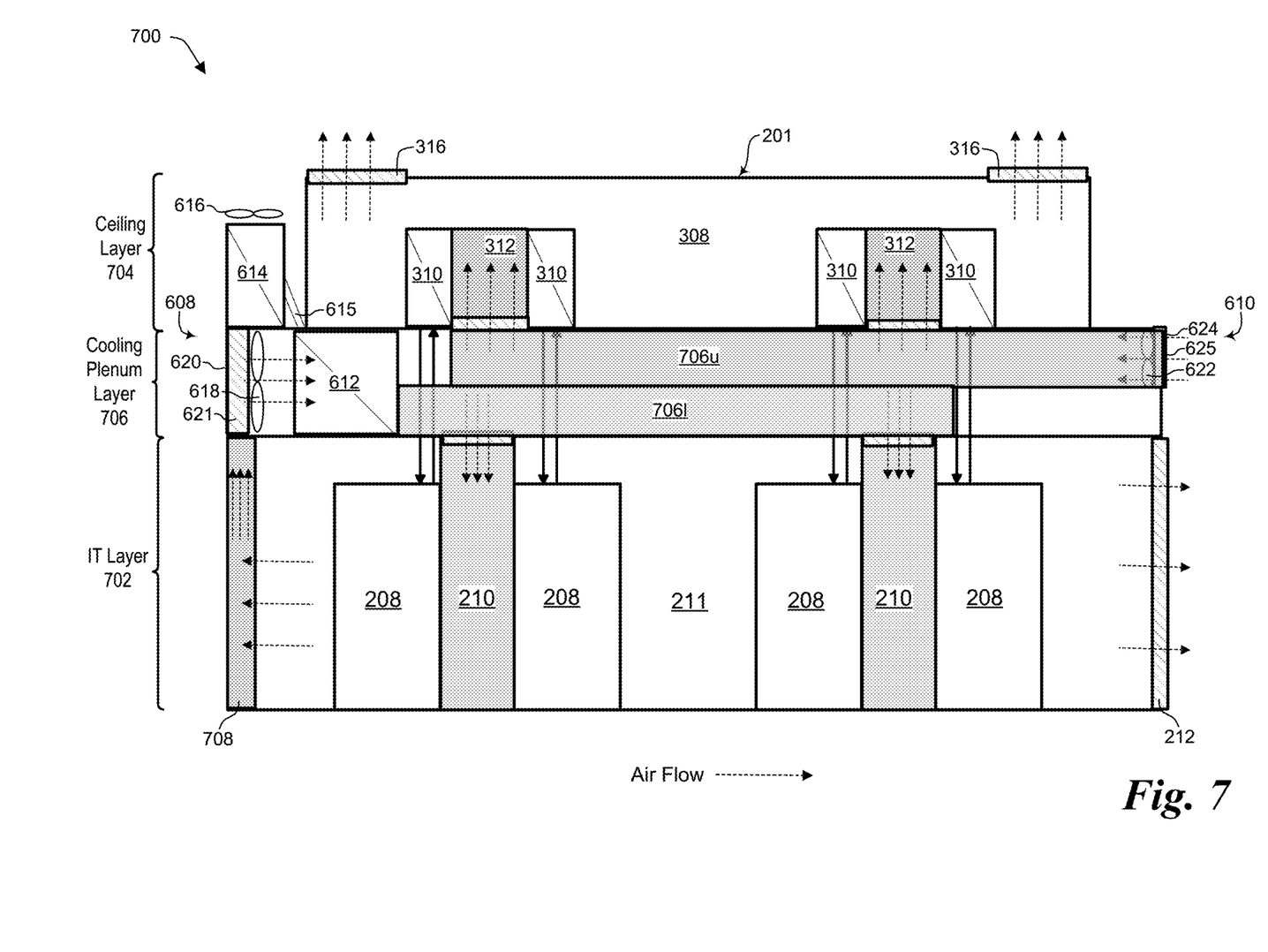
FIG. 7 is a side view of another embodiment of a data center cooling system as viewed looking at the end of IT racks.

FIG. 7 illustrates another embodiment of a data center cooling system 700. System 700 is in most respects similar to system 600: it includes an IT layer 702, a ceiling layer 704 positioned above the IT layer, and a cooling plenum layer 706 sandwiched between the IT layer and the ceiling layer. Ceiling layer 704 is substantially the same as ceiling layer 604, as described above for FIG. 6, but IT layer 702 and cooling plenum layer 706 differ from their respective counterparts in system 600—IT layer 602 and cooling plenum layer 606, respectively.

Cooling plenum layer 706 shares some similarities with cooling plenum layer 606 in that it has multiple air intakes with different functions. In the illustrated embodiment, cooling plenum layer has an enhanced intake 608 and an economized intake 610, both of which can have all the same components and attributes described above in FIG. 6 for these same elements. The primary difference between cooling plenum layers 606 and 706 is that cooling plenum layer 706 is divided into two parts: a lower cooling plenum 706l and an upper cooling plenum 706u. Lower cooling plenum 706l is fluidly coupled to enhanced intake 608 and to IT plenums 210, so that it supplies cool air only to IT layer 702. Upper cooling plenum 706u is fluidly coupled to economized intake 610 and to ceiling plenums 312, so that it supplies ambient air only to ceiling layer 704. System 700 can be useful, for instance, when the ceiling layer and IT layer have different cooling requirements. And even though there are two plenums 706l and 706u, in other embodiments they can be combined to function as a single channel.

IT layer 702 also shares some similarities with IT layer 602, in that it houses racks 208 that are clustered around IT plenums 210. But IT layer 702 also includes a return plenum 708. The illustrated embodiment has one return plenum, but other embodiments can have more than one. Return plenum 708 returns hot air from IT layer 702 to the enhanced intake 608, where it can be cooled, filtered, and directed back into lower plenum 706l. IT layer 702 also differs from IT layer 602 in that its IT plenums 210 are fluidly coupled, via flow controls, only to the lower cooling plenum 706l instead of being coupled to the entire cooling plenum layer. In one embodiment, if direct outside air is taken to the plenum 706l and then supplied to the 210, exhaust 212 is used for exhausting hot air.

In operation, enhanced intake 608 and economized intake 610 can operate independently. At any given time one can be open and the other closed, or both can be open simultaneously. When open simultaneously, enhanced intake 608 and economized intake 610 can have the same or different flow rates. Once cool airflow is established using one or both intakes, the cool air proceeds through cooling plenum layer 706l to IT layer 702 and through cooling plenum layer 706u to ceiling layer 704, after which the system operates substantially as discussed above for system 300. System 700 provides flexibility to accommodate different heat load requirements and different ambient conditions.

Other embodiments of cooling systems are possible besides the ones described above. For instance:

The current architecture can be coupled with different types of cooling solutions, or cooling loops;
The multilayer air distribution system can be extended for even more layers for airflow distributions; or
Different IT room cold aisle containment and hot aisle containment can be accommodated in the present architecture.

The above description of embodiments is not intended to be exhaustive or to limit the invention to the described forms. Specific embodiments of, and examples for, the invention are described herein for illustrative purposes, but various modifications are possible.

What is claimed is:

1. A cooling system for use in a data center, the cooling system comprising:
   an IT region including:
      one or more IT plenums for supplying cold air to the IT region,
      a plurality of information technology (IT) racks, each IT rack having a front side through which cool air enters the rack and a rear side through which hot air exits the rack, wherein each IT rack is adapted to house one or more pieces of liquid-cooled or hybrid-cooled information technology (IT) equipment, and wherein clusters of IT racks are grouped around at least one of the one or more IT plenums, each cluster including at least one IT rack in which the front side of the IT rack is fluidly coupled to the IT plenum, and
   a ceiling region positioned above the IT region, the ceiling region including:
      one or more ceiling plenums, and
      one or more sets of heat exchangers, wherein each heat exchanger in each set is fluidly coupled to a ceiling plenum, and wherein each heat exchanger is a liquid-to-air heat exchanger adapted to be fluidly coupled to at least one piece of liquid-cooled or hybrid-cooled IT equipment in one of the clusters of IT racks; and
   a cooling air plenum sandwiched between the IT region and the ceiling region, wherein the cooling air plenum is fluidly coupled to the one or more IT plenums by a flow control and is fluidly coupled by a flow control to the one or more ceiling plenums or to a volume of the ceiling region between ceiling plenums.

2. The cooling system of claim 1 wherein the one or more ceiling plenums are fluidly coupled to the cooling air plenum and wherein the ceiling region includes at least one hot air exhaust.

3. The cooling system of claim 1 wherein the one or more ceiling plenums are exhaust plenums fluidly coupled to the volume of the ceiling region or to an exterior of the data center.

4. The cooling system of claim 1 wherein the cooling air plenum is fluidly coupled to an exterior of the data center by at least one fresh air intake.

5. The cooling system of claim 1, further comprising an external cooling module positioned outside the data center and fluidly coupled to the cooling air plenum, wherein the external cooling module includes at least one of:
   a fan to pump airflow into the cooling air plenum;
   an air filter to filter air before it flows into the cooling plenum; or
   a heat exchanger to cool outside air entering the cooling air plenum.

6. The cooling system of claim 1, further comprising a recirculation module, the recirculation module including a heat exchanger fluidly coupled to the IT region, the ceiling region, and the cooling air plenum, wherein hot air from the ceiling region and from the IT region is exhausted to the recirculation module so that the heat exchanger can transfer heat from the hot air entering the recirculation module to outside air and return cooling air to the cooling air plenum.

7. The cooling system of claim 1 wherein the cooling air plenum includes an economized inlet for intake of uncooled air and an enhanced inlet for intake of cooled air.

8. The cooling system of claim 7, further comprising a cooling air plenum module positioned at or near the enhanced inlet, the cooling air plenum module including:
   a fan to pump airflow into the cooling air plenum;
   a heat exchanger to cool air before the air is pumped into the cooling air plenum.

9. The cooling system of claim 8 wherein the heat exchanger includes an evaporator fluidly coupled to a condenser and a compressor to form a refrigerant loop.

10. The cooling system of claim 7 wherein the cooling air plenum includes first and second plenums, the first plenum being coupled to the economized inlet and the second plenum being coupled to the enhanced inlet.

11. A data center comprising:
   a data center facility;
   a cooling system positioned in the data center facility, the cooling system comprising:
      an IT region including:
         one or more IT plenums for supplying cold air to the IT region,
         a plurality of information technology (IT) racks, each IT rack having a front side through which cool air enters the rack and a rear side through which hot air exits the rack, wherein each IT rack houses one or more pieces of liquid-cooled or hybrid-cooled information technology (IT) equipment, and wherein clusters of IT racks are grouped around at least one of the one or more IT plenums, each cluster including at least one IT rack in which the front side of the IT rack is fluidly coupled to the IT plenum, and
      a ceiling region positioned above the IT region, the ceiling region including:
         one or more ceiling plenums, and
         one or more sets of heat exchangers, wherein each heat exchanger in each set is fluidly coupled to a ceiling plenum, and wherein each heat exchanger is a liquid-to-air heat exchanger fluidly coupled to at least one piece of liquid-cooled or hybrid-cooled IT equipment in one of the clusters of IT racks; and
      a cooling air plenum sandwiched between the IT region and the ceiling region, wherein the cooling air plenum is fluidly coupled to the one or more IT plenums by a flow control and is fluidly coupled by a flow control to the one or more ceiling plenums or to a volume of the ceiling region between ceiling plenums.

12. The data center of claim 11 wherein the one or more ceiling plenums are fluidly coupled to the cooling air plenum and wherein the ceiling region includes at least one hot air exhaust.

13. The data center of claim 11 wherein the one or more ceiling plenums are exhaust plenums fluidly coupled to the volume of the ceiling region or to an exterior of the data center.

14. The data center of claim 11 wherein the cooling air plenum is fluidly coupled to an exterior of the data center by at least one fresh air intake.

15. The data center of claim 11, further comprising an external cooling module positioned outside the data center and fluidly coupled to the cooling air plenum, wherein the external cooling module includes at least one of:
   a fan to pump airflow in the cooling air plenum;
   an air filter to filter air before it flows into the cooling plenum; or
   a heat exchanger to cool outside air entering the cooling air plenum.

16. The data center of claim 11, further comprising a recirculation module, the recirculation module including a heat exchanger fluidly coupled to the IT region, the ceiling region, and the cooling air plenum, wherein hot air from the ceiling region and from the IT region is exhausted to the recirculation module so that the heat exchanger can transfer heat from the hot air entering the recirculation module to outside air and return cool air to the cooling air plenum.

17. The data center of claim 11 wherein the cooling air plenum includes an economized inlet for intake of uncooled air and an enhanced inlet for intake of cooled air.

18. The data center of claim 17, further comprising a cooling air plenum module positioned at or near the enhanced inlet, the cooling air plenum module including:
   a fan to pump airflow in the cooling air plenum;
   a heat exchanger to cool air before the air is pumped into the cooling air plenum.

19. The data center of claim 18 wherein the heat exchanger includes an evaporator fluidly coupled to a condenser and a compressor to form a refrigerant loop.

20. The data center of claim 17 wherein the cooling air plenum includes first and second plenums, the first plenum being coupled to the economized inlet and the second plenum being coupled to the enhanced inlet.

\* \* \* \* \*